United States Patent [19]

Hartmann et al.

[11] 4,320,337
[45] Mar. 16, 1982

[54] COMBINED CURRENT AND VOLTAGE CONVERTER FOR A COMPRESSED-GAS INSULATED METAL-ENCLOSED HIGH VOLTAGE INSTALLATION

[75] Inventors: Hans Hartmann, Zurich; Gerhard Mauthe, Birmenstorf, both of Switzerland

[73] Assignee: BBC Brown, Boveri & Company, Ltd., Baden, Switzerland

[21] Appl. No.: 165,482

[22] PCT Filed: Jan. 23, 1979

[86] PCT No.: PCT/CH79/00005
§ 371 Date: Nov. 9, 1979
§ 102(e) Date: Sep. 6, 1979

[87] PCT Pub. No.: WO79/00729
PCT Pub. Date: Oct. 4, 1979

[30] Foreign Application Priority Data

Mar. 9, 1978 [CH] Switzerland .................... 2554/78

[51] Int. Cl.³ .............................................. H01F 40/08
[52] U.S. Cl. ...................................... 323/358; 324/72; 324/126; 336/174
[58] Field of Search ............... 323/233, 358, 364; 336/174, 175; 324/72, 72.5, 126, 133; 174/28

[56] References Cited

U.S. PATENT DOCUMENTS

| | | | |
|---|---|---|---|
| 3,538,440 | 11/1970 | Galloway | 324/126 X |
| 3,869,665 | 3/1975 | Kenmochi et al. | 324/72 |
| 3,900,791 | 8/1975 | Kleen et al. | 174/28 X |
| 3,942,099 | 3/1976 | Freygang et al. | 336/174 X |
| 3,959,761 | 5/1976 | Graul | 336/174 X |
| 4,277,746 | 7/1981 | Abe et al. | 323/364 X |

*Primary Examiner*—Harry E. Moose, Jr.
*Attorney, Agent, or Firm*—Burns, Doane, Swecker & Mathis

[57] ABSTRACT

The invention relates to a combined current and voltage converter for metal-enclosed high-voltage installations with compressed-gas filling. In order to be able to avoid any passages for the connecting leads through the housing (1, 2), the electrode of the capacitive voltage converter part consists of an intermediate element (3) inserted into the housing in an insulated and gas pressure-tight manner. The intermediate element (3) has on its outside a layer of insulating material (9) and on top of this a metal layer (10). The whole (3, 9, 10) forms a support body for current converter cores (11) surrounded by secondary windings. The low-voltage capacity between the intermediate element (3) and the metal layer (10) is fed to an electronic measuring amplifier (14) via a screened measuring cable (12/12a). The current converter cores (11) are protected mechanically by a sheath tube (16), the latter simultaneously conducting housing currents. FIG. 1.

8 Claims, 3 Drawing Figures

COMBINED CURRENT AND VOLTAGE CONVERTER FOR A COMPRESSED-GAS INSULATED METAL-ENCLOSED HIGH VOLTAGE INSTALLATION

The present invention relates to a combined current and voltage converter according to the pre-characterising clause of Patent Claim 1, hereinafter called combination converter for the sake of brevity.

With voltage converters for an enclosed high voltage installation filled with pressure gas, such as, e.g., $SF_6$ it is known to obtain the measuring voltage by means of capacitive voltage division (Germal Offenlegungsschrift No. 2,139,225). Furthermore, it is also known (German Offenlegungsschrift No. 2,325,441) to create a combination converter by providing additional current converter cores with windings. However, the known combination converters possess the common feature that the electrode used for voltage measurements, as well as the current converter cores possibly provided, are arranged inside the housing, necessitating insulating passages in order to pass the secondary connections to the outside of the housing. In addition, if the current converter cores are dried insufficiently, the danger also exists that the $SF_6$ gas becomes moist. Finally, a combination converter has also become known (German Utility Model No. 74,07,268) in which one metal layer forming one electrode for the capacitive voltage division is still situated inside the housing, requiring a passage through the housing, even though the current converter core is arranged to be located outside of the $SF_6$ gas filling. In addition, the intermediate element carrying the metal layer is an insulating tube exposed to the internal pressure existing inside the housing.

It is the object of the invention to provide a combination converter which does not require any passage to the outside through the housing. In addition, it should be possible to accommodate several current converter cores in a simple manner.

The aforementioned object is achieved according to the invention by the measures specified in the characterising clauses of patent claims 1 to 8.

In this arrangement it is of advantage that by using a metallic intermediate element inserted in an insulated manner between the housing, the resistance of the latter to the internal pressure is high, even with a relatively great number of current converter cores, thus avoiding any weak points in the high voltage installation.

An advantageous embodiment is achieved with respect to the connection to the parts of the housing adjoining the combination converter by the measures according to the characterising clauses of patent claims 2 to 4. The measure according to the characterising clause of patent claim 5 results in an additional possibility for conducting the housing currents without distorting effect on the measuring current, apart from providing a simple protective cover for the current converter cores.

The drawing represents an illustrative embodiment of the invention, in which.

Figure 1:
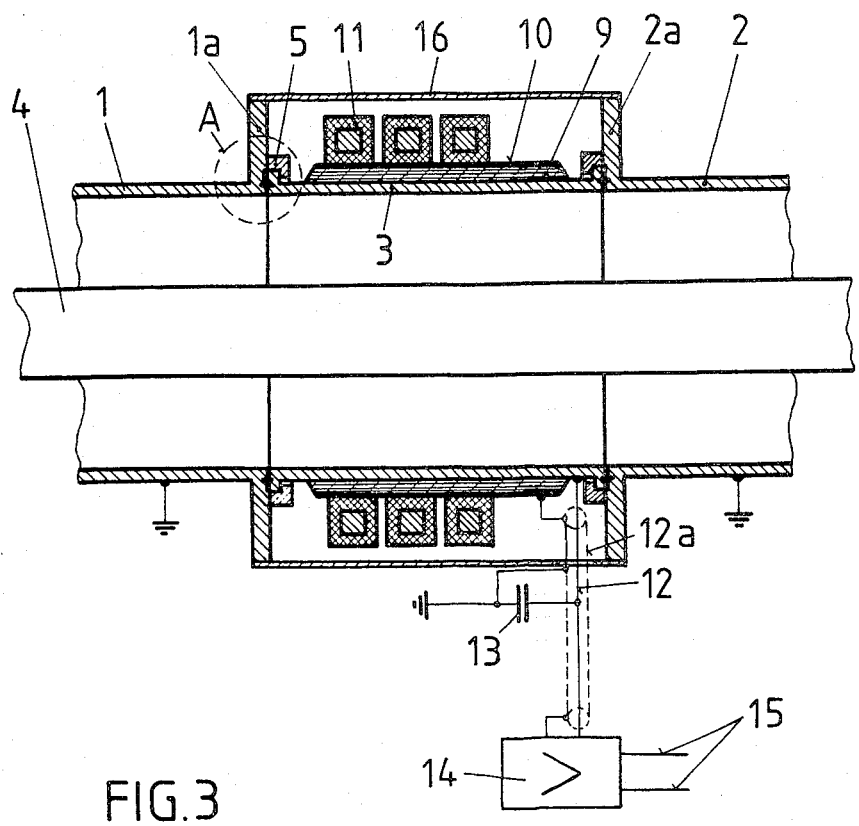
FIG. 1 shows a section of the combination converter.
Figure 2:
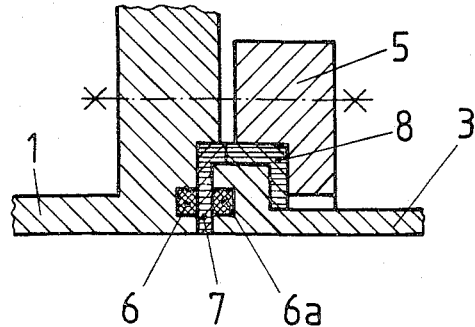
FIG. 2 shows the detail A in FIG. 1 on an enlarged scale, whilst

In FIG. 1 there is located between the housing 1, 2 the intermediate element 3, inserted in an insulated manner, which has virtually the same inside diameter and wall thickness as the housing. Parts 1 to 3 suitably consist of a light metal, such as aluminium or one of its alloys. 4 designates the conductor carrying a high voltage, mounted to be insulated inside housing 1, 2 in a known manner. The interior of the housing is filled with pressure gas, such as, e.g., $SF_6$. FIG. 2, showing the detail A of FIG. 1 on an enlarged scale, shows the connection of intermediate element 3 to housing 1 in greater detail. Between housing 1 and intermediate element 3, insulating parts 7, 8 are arranged, insulating part 8 insulating the pressure ring 5 with respect to intermediate part 3. Pressure ring 5 and housing 1 are flanged together by means of screw connections indicated symbolically. If pressure ring 5 consists of a reinforced insulating plastic, instead of metal, insulating part 8 can possibly be omitted in order to simplify the structure. Further simplification can be achieved if insulating part 7 and seals 6, 6a resting against it are produced as one piece. In this arrangement the insulating parts are preferably produced as compression mouldings of a plastic with good mechanical and electrical properties. The outside of intermediate element 3 is provided with a layer of insulating material 9. The latter is preferably wound onto intermediate element 3, in a manner known in itself, from thin plastic film with good electrical properties. The metal layer 10, for its part, again is applied to the outside of insulating layer 9. It can consist preferably of a copper gauze, used frequently in the construction of converters, coated with adhesive and wound onto the insulating layer. The parts 3, 9, 10 are used as supporting bodies for the current converter cores 11 with windings. The latter are fixed on metal layer 10 with the use of insulating intermediate layers, not shown in greater detail, by means of additional bindings and a putty compound hardening in air. The length of parts 3, 9, 10 is suitably dimensioned in such a manner that a greater number, for example five, of current converter cores 11 can be accommodated. For this purpose measuring and protection cores of different power and accuracy class, producing different core lengths, can be considered. The metallic sheath tube 16, connecting housing 1, 2 in a conducting manner, provides mechanical protection for current converter cores 11, on the one hand, and on the other hand prevents that the housing currents flowing in housing 1, 2 have any distorting effect on the measuring current.

Figure 3:
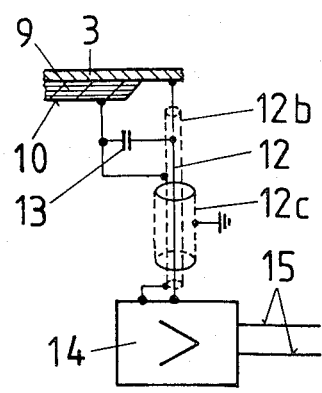
FIG. 3 shows a variant with reference to the measuring cable leading to the voltage measuring amplifier.

While in the voltage converter part the high-voltage capacity is given by the natural capacity between conductor 4 and intermediate element 3, the low-voltage capacity is composed of several part-capacities. These are: the capacity between parts 3 and 10, that of measuring cable 12, 12a and of additional capacitor 13, as well as possibly that between parts 3 and 5/1/1a. The additional capacitor can be used to compensate for the capacity of the measuring cable which differs according to its different length according to the place of installation of the capacitive divider and of the measuring amplifier. In this manner, and by selecting a certain temperature coefficient of additional capacitor 13, a great accuracy can be achieved for the ratio of high- to low-voltage capacity over a wide temperature range. In FIG. 1 the screened measuring cable 12/12a has one core. Its screen 12a is connected to the metal layer 10 and to one end of the additional capacitor 13, and also earthed. In FIG. 3 the screened measuring cable 12/12*b*/12*c* has two cores. This provides the possibility to feed core 12*b* into measuring amplifier 14 in an insulated manner. As electronic measuring amplifiers, commercially available types can be used. Their output is indicated as 15. The additional capacitor 13 can be associated with an over-voltage protection device (not shown) for its protection. In the arrangement according to FIG. 3, the additional capacitor 13 and the capacity between parts 3 and 10 can be included in the feedback circuit of measuring amplifier 14.

We claim:

1. Combined current and voltage converter for a compressed-gas insulated metal-enclosed high voltage installation in which the measuring voltage is obtained by means of capacitive voltage division and the measuring current is obtained by means of at least one toroid core with winding, arranged outside of the housing, characterised in that the housing (1, 2) contains a metallic intermediate element (3) inserted in an insulated manner, the outside of which is provided with a layer of insulating material (9), and that the outside of the latter (9) is provided with a metal layer (10), and that the whole (3, 9, 10) forms a support body for the toroid core(s) (11).

2. Combination converter according to patent claim 1, characterised in that the front faces of the intermediate element (3) are flanged to housing (1, 2) by means of a pressure ring (5) with interposition of pressure-resisting insulating parts (7, 8) and seals (6, 6*a*).

3. Combination converter according to patent claim 2, characterised in that the pressure ring (5) consists of insulating material.

4. Combination converter according to patent claim 2, characterised in that the insulating part (7), located between housing (1, 2) and intermediate element (3), and the seals (6, 6*a*), resting against it, consist of one piece.

5. Combination converter according to patent claim 1, characterised in that housing (1, 2) is provided with flanges (1*a*, 2*a*), the diameter of which is dimensioned in such a way that a metallic sheath tube (16), connecting the flanges, encloses the toroid cores (11).

6. Combination converter according to patent claim 1, characterised in that the intermediate element (3) and the metal layer (10) are connected to the input of a measuring amplifier (14) via a screened measuring cable (12, 12*a* or 12, 12*b*, 12*c*).

7. Combination converter according to patent claim 6, characterised in that an additional capacitor (13) is shunted across the capacity formed by intermediate element (3) and metal layer (10).

8. Combination converter according to patent claim 7, characterised in that the additional capacitor (13) is associated with an over-voltage protection device.

* * * * *